US012543558B2

(12) United States Patent
Guler et al.

(10) Patent No.: US 12,543,558 B2
(45) Date of Patent: Feb. 3, 2026

(54) SELF-ALIGNED INTERCONNECT FEATURES FOR TRANSISTOR CONTACTS

(71) Applicant: Intel Corporation, Santa Clara, CA (US)

(72) Inventors: Leonard P. Guler, Hillsboro, OR (US); Chanaka D. Munasinghe, Portland, OR (US); Manish Chandhok, Beaverton, OR (US); Charles H. Wallace, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 825 days.

(21) Appl. No.: 17/685,541

(22) Filed: Mar. 3, 2022

(65) Prior Publication Data
US 2023/0282575 A1    Sep. 7, 2023

(51) Int. Cl.
| | | |
|---|---|---|
| *H01L 23/528* | (2006.01) | |
| *H01L 21/768* | (2006.01) | |
| *H01L 23/522* | (2006.01) | |
| *H01L 23/532* | (2006.01) | |
| *H10D 64/01* | (2025.01) | |

(Continued)

(52) U.S. Cl.
CPC .... *H01L 23/5283* (2013.01); *H01L 21/76897* (2013.01); *H01L 23/5226* (2013.01); *H01L 23/5329* (2013.01); *H10D 64/01* (2025.01); *H10D 64/258* (2025.01); *H10D 84/0149* (2025.01); *H10D 84/038* (2025.01); *H10D 84/83* (2025.01)

(58) Field of Classification Search
CPC .......... H01L 23/5283; H01L 21/76897; H01L 23/5226; H01L 23/53295; H01L 23/485; H10D 64/258; H10D 84/0149
See application file for complete search history.

(56) References Cited

U.S. PATENT DOCUMENTS 11,508,726 B2 *   11/2022   Jisong ............... H01L 21/76802
2009/0236583 A1 *   9/2009   Kuo .................... H10N 70/8828
                                                                   438/54

(Continued)

OTHER PUBLICATIONS

Extended European Search Report received for EP Application No. 23154120.2 dated Jul. 19, 2023. 9 pages.

*Primary Examiner* — Bac H Au
(74) *Attorney, Agent, or Firm* — Arcane Law PLLC

(57) ABSTRACT

An integrated circuit includes (i) a first transistor device having a first source or drain region coupled to a first source or drain contact, and a first gate electrode, (ii) a second transistor device having a second source or drain region coupled to a second source or drain contact, and a second gate electrode, (iii) a first dielectric material above the first and second source or drain contacts, (iv) a second dielectric material above the first and second gate electrodes, (v) a third dielectric material above the first and second dielectric materials, and (vi) an interconnect feature above and conductively coupled to the first source or drain contact. In an example, the interconnect feature comprises an upper body of conductive material extending within the third dielectric material, and a lower body of conductive material extending within the first dielectric material, with an interface between the upper and lower bodies.

20 Claims, 10 Drawing Sheets

(51) Int. Cl.
*H10D 64/23* (2025.01)
*H10D 84/01* (2025.01)
*H10D 84/03* (2025.01)
*H10D 84/83* (2025.01)

(56) References Cited

U.S. PATENT DOCUMENTS

| | | | |
|---|---|---|---|
| 2015/0364371 A1* | 12/2015 | Yen | H10D 84/0149 |
| | | | 438/666 |
| 2017/0040318 A1* | 2/2017 | Hung | H10D 84/038 |
| 2018/0033866 A1* | 2/2018 | Liao | H01L 21/76897 |
| 2018/0122919 A1 | 5/2018 | Park et al. | |
| 2018/0174904 A1 | 6/2018 | Hsieh et al. | |
| 2018/0301371 A1* | 10/2018 | Wang | H10D 64/667 |
| 2020/0035605 A1* | 1/2020 | Tsai | H01L 23/5384 |
| 2020/0105931 A1* | 4/2020 | Wu | H10D 62/822 |
| 2020/0135641 A1* | 4/2020 | Lee | H01L 23/5226 |
| 2020/0135871 A1* | 4/2020 | Tsai | H01L 21/76856 |
| 2020/0350414 A1* | 11/2020 | Lee | H10D 64/017 |
| 2020/0365698 A1 | 11/2020 | Tsai et al. | |
| 2021/0098377 A1* | 4/2021 | Kim | H10D 62/151 |
| 2021/0193511 A1* | 6/2021 | Wang | H01L 23/53266 |

\* cited by examiner

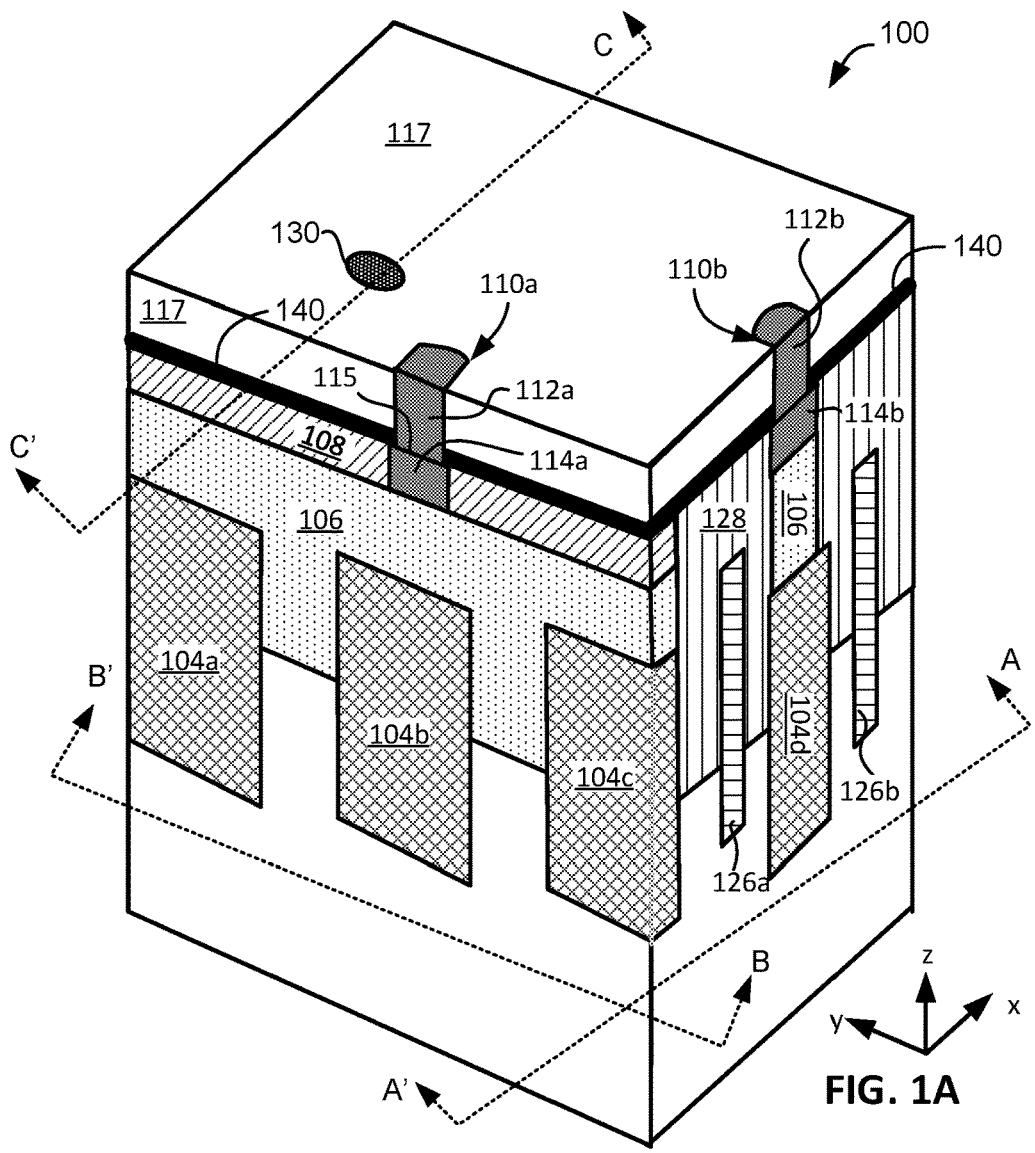
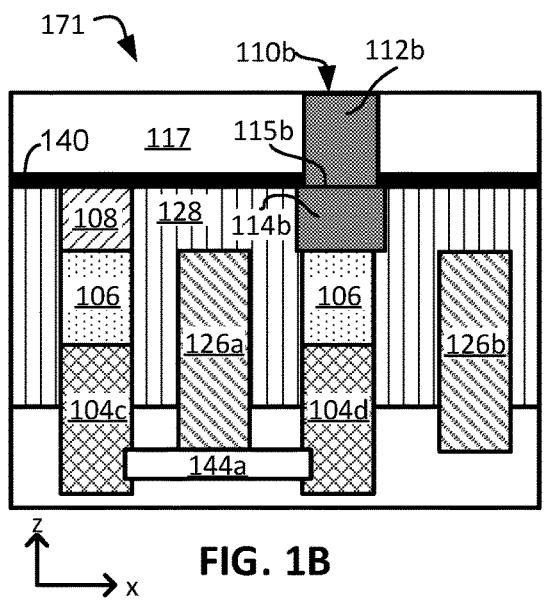
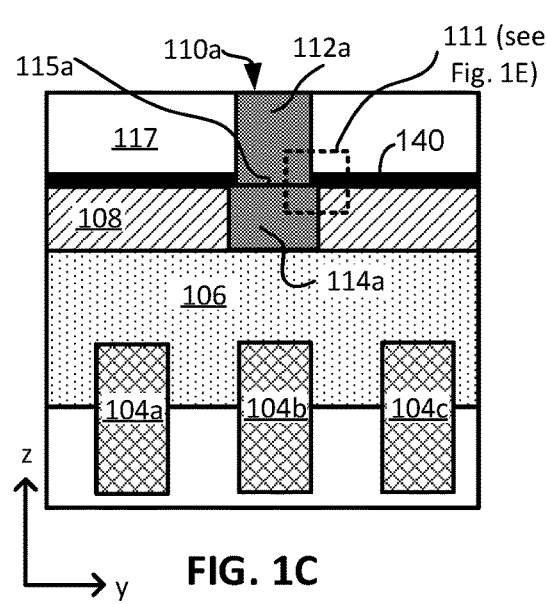
FIG. 1A
FIG. 1B
FIG. 1C

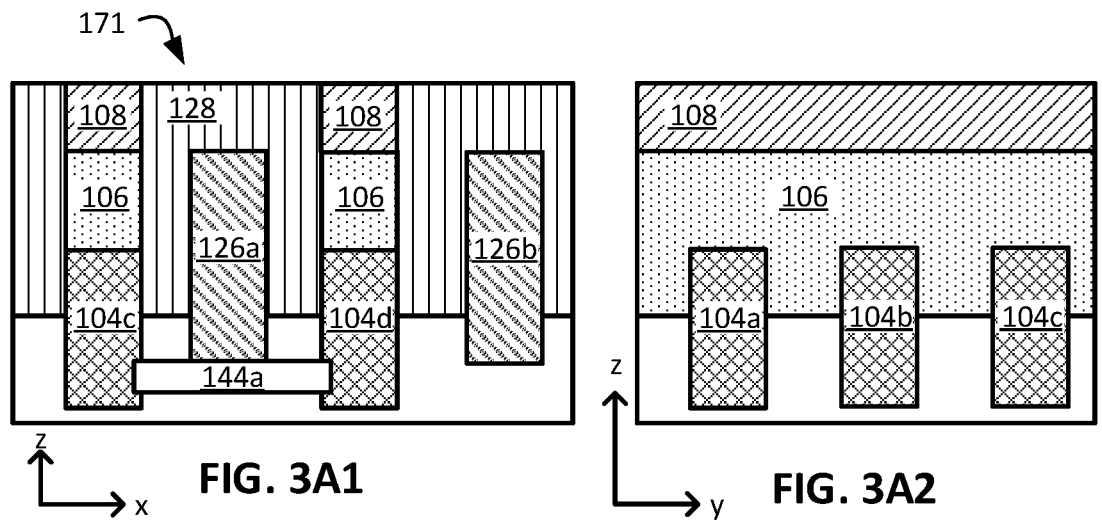
FIG. 3A1    FIG. 3A2
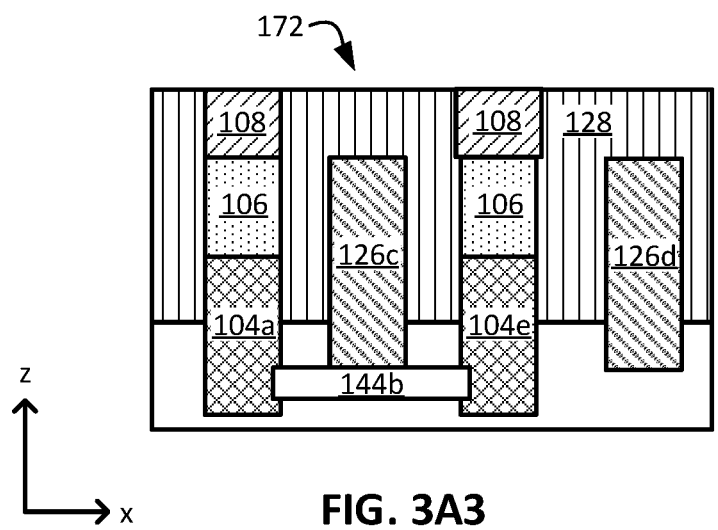
FIG. 3A3

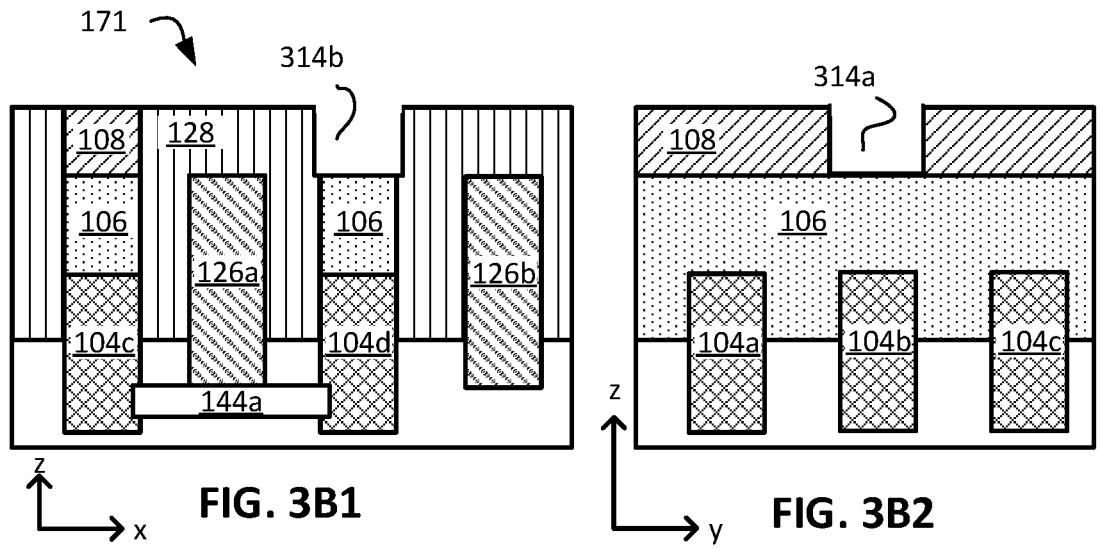
FIG. 3B1  FIG. 3B2
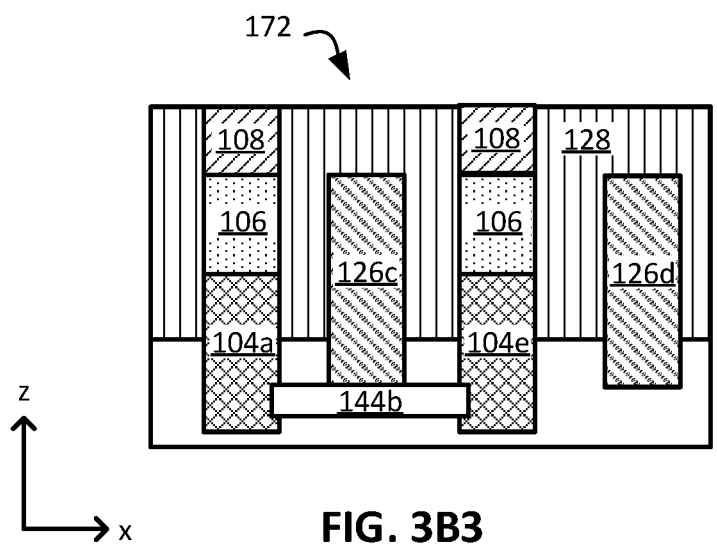
FIG. 3B3

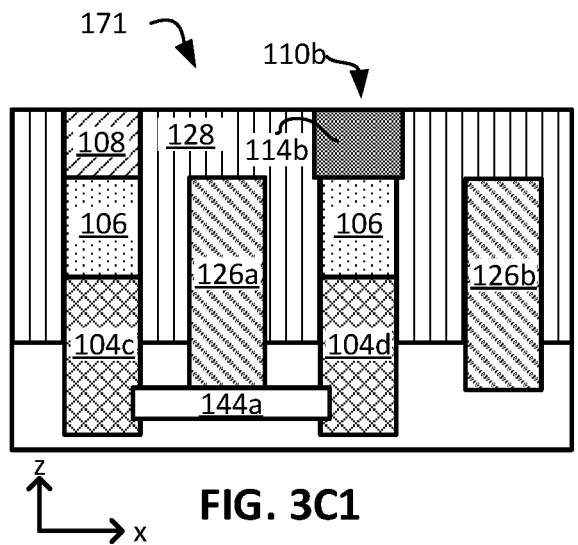
FIG. 3C1
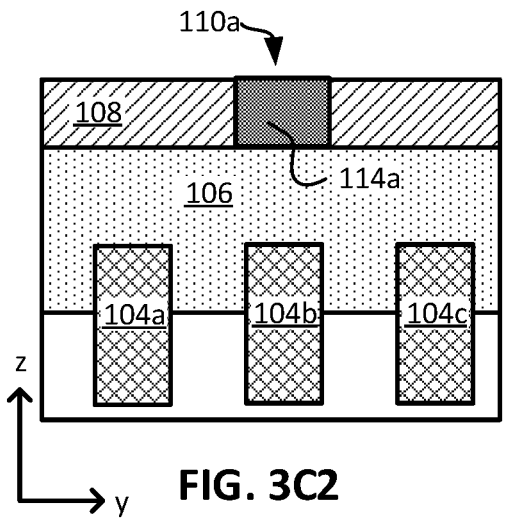
FIG. 3C2
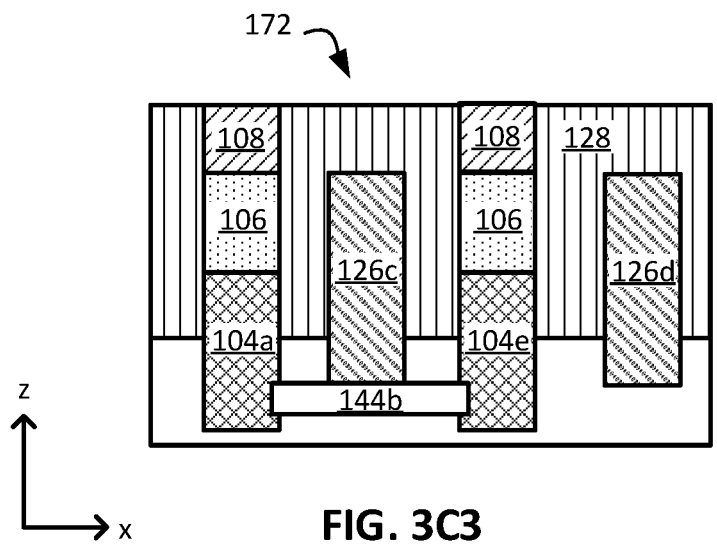
FIG. 3C3

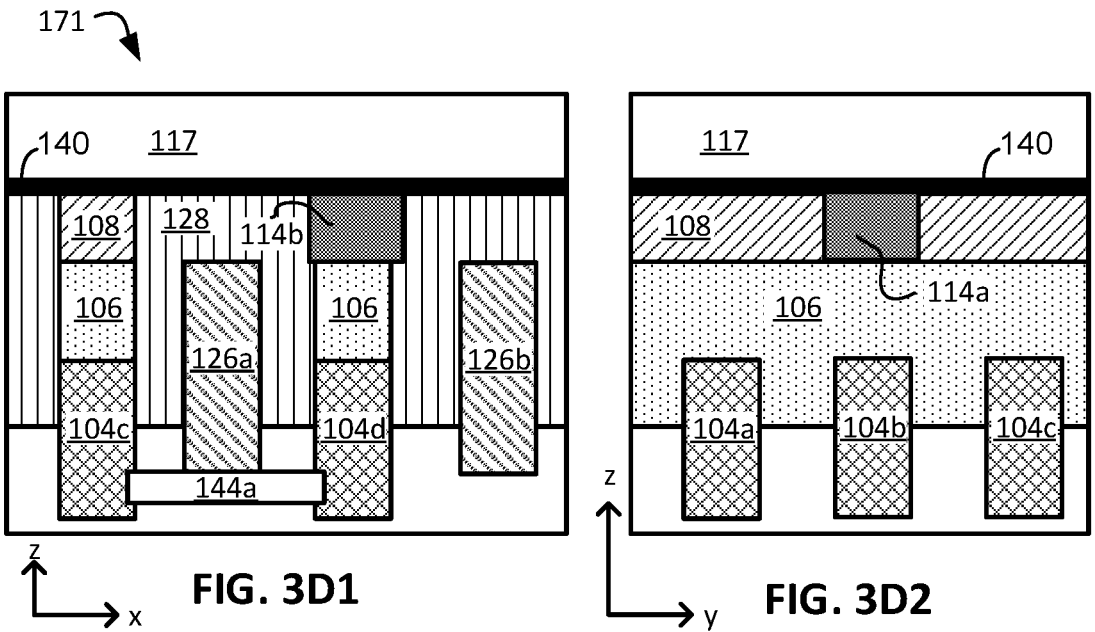
FIG. 3D1
FIG. 3D2
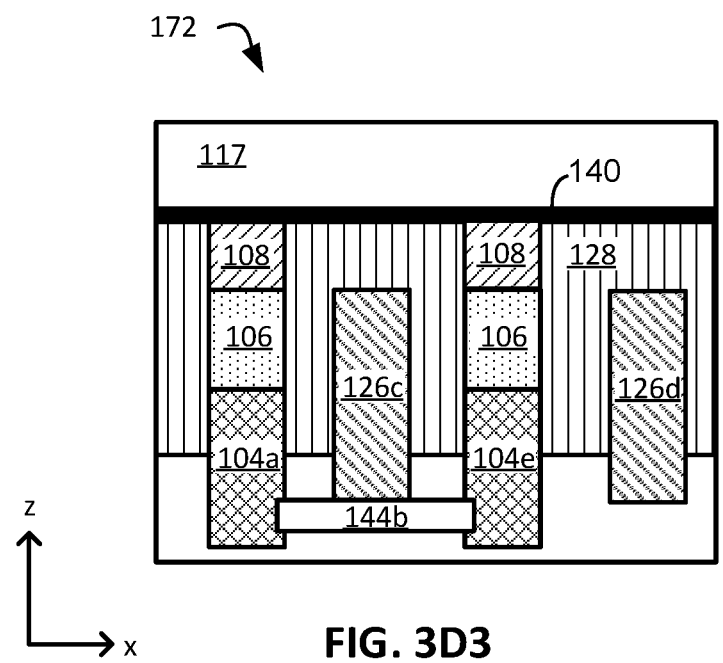
FIG. 3D3

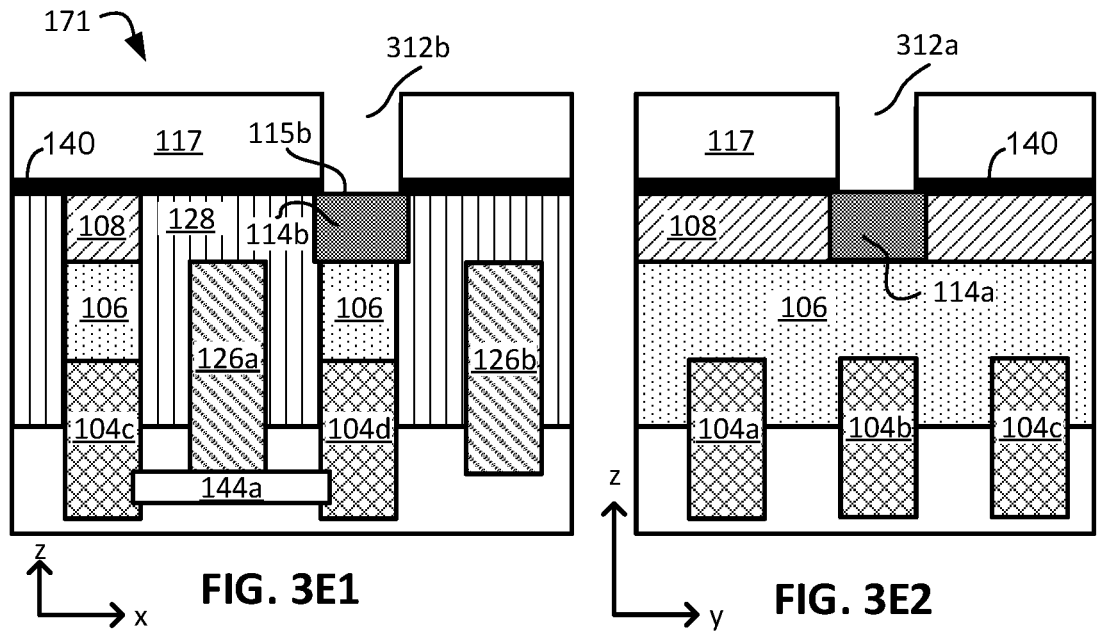
FIG. 3E1
FIG. 3E2
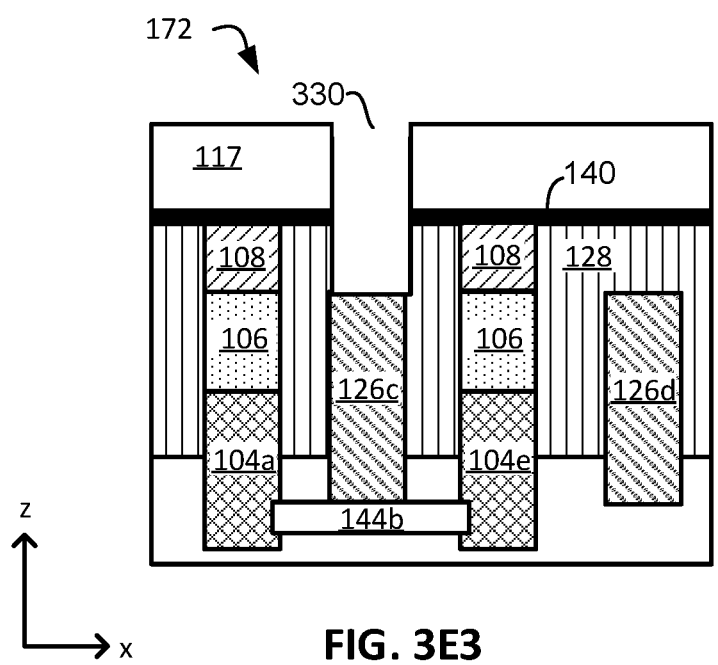
FIG. 3E3

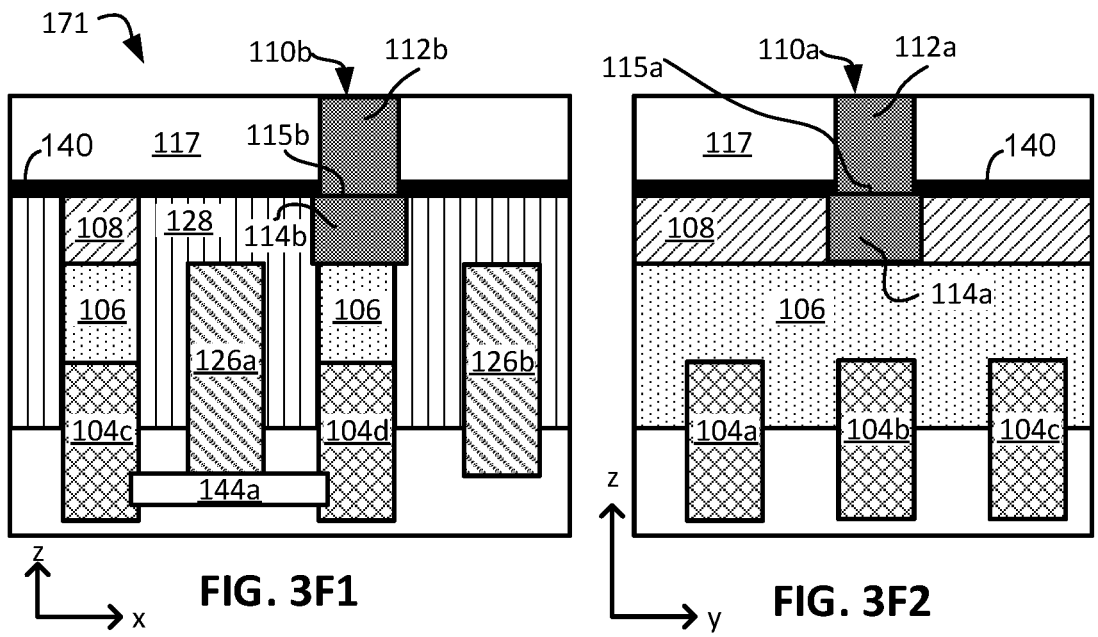
FIG. 3F1  FIG. 3F2
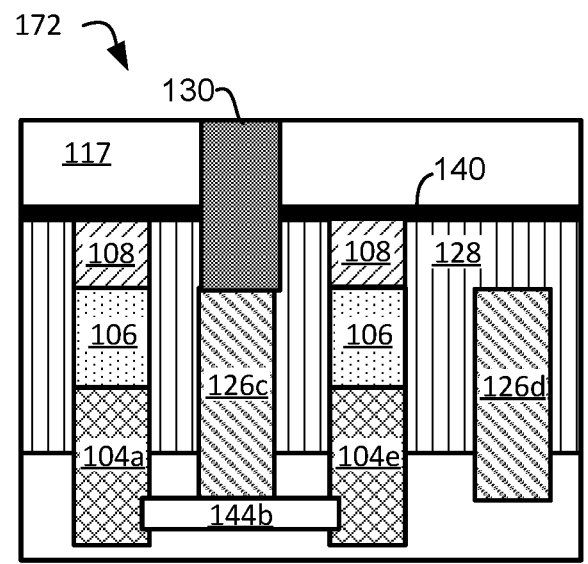
FIG. 3F3

SELF-ALIGNED INTERCONNECT FEATURES FOR TRANSISTOR CONTACTS

FIELD OF THE DISCLOSURE

The present disclosure relates to integrated circuits, and more particularly, to interconnect features for signal routing.

BACKGROUND

As integrated circuits continue to scale downward in size, a number of challenges arise. For instance, with scaling of transistors, a distance between a source or drain region and a gate electrode is also correspondingly scaled. This poses challenges in forming interconnect features for source or drain contacts and gate electrodes.

BRIEF DESCRIPTION OF THE DRAWINGS

FIGS. 1A, 1B, 1C, and 1D illustrate various perspective and cross-sectional views of a section of an integrated circuit (IC) comprising (i) an array of transistors having a plurality of source and drain regions (also referred to herein as diffusion regions), and a plurality of gate regions comprising corresponding gate electrodes, (ii) a source or drain interconnect feature at least partially landed on a source or drain contact, the source or drain interconnect feature having an upper body of conductive material, a lower body of conductive material, and an interface therebetween, and (iii) a gate interconnect feature at least partially landed on a gate region, the gate interconnect feature having a continuous and monolithic body of conductive material, without any interface between an upper and a lower portion of the gate interconnect feature, in accordance with an embodiment of the present disclosure.

FIGS. 3A1, 3A2, 3A3, 3B1, 3B2, 3B3, 3C1, 3C2, 3C3, 3D1, 3D2, 3D3, 3E1, 3E2, 3E3, 3F1, 3F2, and 3F3 illustrate various cross-sectional views of an IC (such as the IC of FIGS. 1A-1F) in various stages of processing, in accordance with an embodiment of the present disclosure.

Figure 1D:
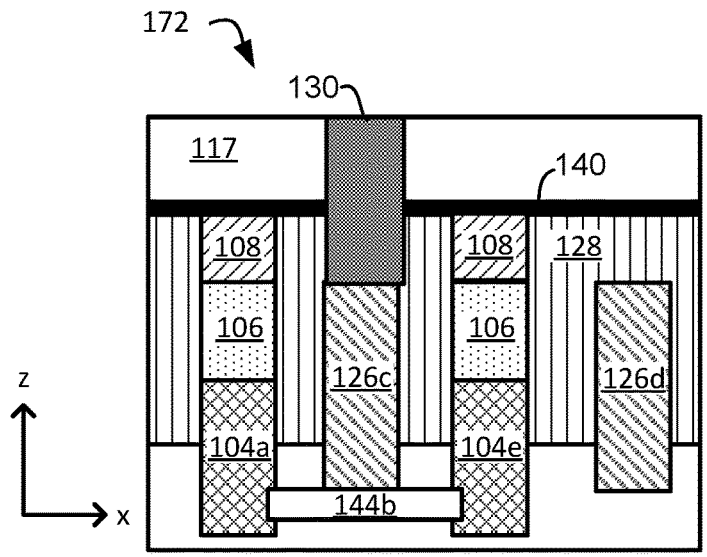

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are provided herein for forming self-aligned interconnect features that are conductively coupled to source or drain contacts of one or more transistors, and self-aligned interconnect features that are conductively coupled to gate electrodes of one or more transistors. The techniques are particularly useful with respect to integrated circuit structures comprising high density interconnect features, but can be used to provision any number of interconnect schemes and configurations. In one embodiment, an integrated circuit comprises a first transistor device having (i) a first source or drain region coupled to a first source or drain contact, and (ii) a first gate electrode. The integrated circuit further comprises a second transistor device having (i) a second source or drain region coupled to a second source or drain contact, and (ii) a second gate electrode. The integrated circuit also comprises a first dielectric material above the first and second source or drain contacts, a second dielectric material above the first and second gate electrodes, and a third dielectric material above the first and second dielectric materials. In an example, the first dielectric material is compositionally different from, and etch selective to, the second dielectric material. In an example, a first interconnect feature is above and conductively coupled to the first source or drain contact, and a second interconnect feature is above and conductively coupled to one or both of the first and second gate electrodes. In an example, the first interconnect feature comprises (i) an upper body of conductive material extending within the third dielectric material, and (ii) a lower body of conductive material extending within the first dielectric material, with an interface between the upper body and the lower body. In an example, the second interconnect feature comprises a continuous and monolithic body of conductive material extending within the third dielectric material and the second dielectric material.

In another embodiment, an integrated circuit includes a transistor device having a (i) a source region, with a source contact conductively coupled to and above the source region, and (ii) a gate electrode. A first layer comprising a first dielectric material is above the source contact, a second layer comprising a second dielectric material is above the gate electrode, and a third layer comprising a third dielectric material is above the first and second layers. In an example, the first dielectric material is different from the second dielectric material. A first interconnect feature extends through the third layer and the first layer, and is conductively coupled to the source contact. In an example, an upper section of the first interconnect feature extends at least in part within the third layer, a lower section of the first interconnect feature extends at least in part within the first layer, and the upper section of the first interconnect feature is not aligned with the lower section of the first interconnect feature. For example, a substantially horizontal wall of either the upper section or the lower section is between (i) a substantially vertical sidewall of the upper section of the interconnect feature and (ii) a substantially vertical sidewall of the lower section of the interconnect feature. Also, a second interconnect feature extends through the third layer and the second layer, and is conductively coupled to the gate electrode. In an example, an upper section of the second interconnect feature extends within the third layer, a lower section of the second interconnect feature extends within the second layer, and the upper section of the second interconnect feature is substantially aligned with the lower section of the second interconnect feature.

In another embodiment, a method for forming an integrated circuit includes forming a transistor device having a source region, with a source contact conductively coupled to and above the source region, and a gate electrode; and forming a first layer comprising a first dielectric material above the source contact, and a second layer comprising a second dielectric material above the gate electrode, the first dielectric material different from the second dielectric material. In an example, the method further includes forming a lower body of a first interconnect feature that extends within the first layer and that at least partially lands on the source contact. In an example, the method further includes subsequent to forming the lower body, forming a third layer comprising a third dielectric material above the first and second layers, and the lower body of the first interconnect feature. In an example, the method further includes subsequent to forming the third layer, forming (i) an upper body of the first interconnect feature that extends within the third layer and that at least partially lands on the lower body of the first interconnect feature, and (ii) a second interconnect feature that extends within the third and second layers, and that at least partially lands on the gate electrode. Numerous variations, embodiments, and applications will be apparent in light of the present disclosure.

General Overview

As previously noted, with scaling of transistors, a distance between a source or drain region and a gate electrode is also correspondingly scaled. Thus, an interconnect feature intended to land on a source or drain contact may be formed too close to the gate electrode, and/or another interconnect feature intended to land on the gate electrode may be formed too close to the source or drain contact (e.g., due to technical limitations on mask placement, and resultant unintentional mask shift, while forming recesses for the interconnect features). This increases chances of unintentional electrical shorting in the transistor. This problem is exacerbated with increased scaling of transistor, as lateral distance between source or drain contacts and adjacent gate electrodes decreases.

Accordingly, techniques are provided herein to form self-aligned interconnect features for source or drain contacts and self-aligned interconnect features for gate electrodes. For purposes of this disclosure and unless otherwise mentioned, an interconnect feature intended to at least partially land on a source or drain contact is also referred to herein as a source or drain interconnect feature or a diffusion interconnect feature (diffusion region refers to either source or drain), and an interconnect feature intended to at least partially land on a gate electrode is also referred to herein as a gate interconnect feature. In some embodiments, a source or drain interconnect feature discussed herein is self-aligned with respect to a source or drain contact on which the source or drain interconnect feature at least partially lands. That is, the source or drain interconnect feature at least partially lands on the corresponding source or drain contact, but cannot land on a gate electrode (e.g., is separated from the gate electrode by at least a threshold distance), due to the self-alignment of the source or drain interconnect feature. Similarly, in some embodiments, a gate interconnect feature discussed herein is self-aligned with respect to a gate electrode on which the gate interconnect feature at least partially lands. That is, the gate interconnect feature at least partially lands on the corresponding gate electrode, but cannot land on a neighboring source or drain contact (e.g., is separated from the source or drain contact by at least a threshold distance), due to the self-alignment of the gate interconnect feature. This eliminates, or at least reduces, chances of unintentional electrical shorting between the source or drain contacts and the gate electrode in a transistor.

For example, when forming an array of transistors, source or drain contacts are formed over corresponding source or drain regions. A first dielectric material is formed over the source or drain contacts. Similarly, a second dielectric material is formed over the gate electrodes. In one such example, the first dielectric material is etch selective with respect to the second dielectric material. For example, an etch process to etch the first dielectric material does not substantially etch the second dielectric material; and another etch process to etch the second dielectric material does not substantially etch the first dielectric material. The first and second dielectric materials can be any dielectric or interlayer dielectric material (ILD), such as an oxide, nitride, carbide, oxycarbide, oxycarbonitride, or a low-k version of any of these, for example, and long as the etch selectivity between the first and second dielectric materials is maintained.

Subsequent to forming the first and second dielectric materials, a lower body of an interconnect feature is formed over a corresponding source or drain contact. For example, a recess is formed within the first dielectric material, where the recess is above and at least partially lands on the source or drain contact. Conductive material is deposited within the recess, to form the lower body of the source or drain interconnect feature. Note that as the second dielectric material is etch-selective with respect to the first dielectric material, an etch process to form the recess within the first dielectric material does not substantially etch the second dielectric material above the gate electrode. Accordingly, the recess cannot land on, or be too close to (e.g., closer than a threshold distance) the adjacent gate electrode. Thus, the recess, and consequently the lower body of the source or drain interconnect feature, is self-aligned to the corresponding source or drain contact. For example, lower body of the source or drain interconnect feature can land at least partially on the source or drain contact but not on (or near) the gate electrode.

In some embodiments, after formation of the lower body of the source or drain interconnect feature, an etch stop layer is formed above the first and second dielectric materials and the lower body of the source or drain interconnect feature, and then a next level of dielectric material (such as a third dielectric material) is formed above the etch stop layer. The third dielectric material may be same as, or different from, one or both the previously discussed first and second dielectric materials.

Subsequently, an upper body of the source or drain interconnect feature is formed, where the upper body of the source or drain interconnect feature extends through the third dielectric material and the etch stop layer and at least partially lands on the lower body of the source or drain interconnect feature. For example, a recess is formed to extend through the third dielectric material and the etch stop layer and at least partially land on the lower body of the source or drain interconnect feature. The recess is then filed with conductive material, to form the upper body of the source or drain interconnect feature.

Thus, the upper body of the source or drain interconnect feature is formed during a deposition process that is different from the deposition process to form the lower body of the source or drain interconnect feature. Accordingly, an interface is formed between the conductive materials of the upper and lower bodies of the source or drain interconnect feature. The interface may be a seam or a grain boundary. In an example, the interface is substantially coplanar with a bottom surface of the etch stop layer and/or with a top surface of the first and second dielectric materials.

In an example, because the recess for the upper body of the source or drain interconnect feature and the recess for the lower body of the source or drain interconnect feature are formed by two different recess formation processes, the two recesses may not be aligned. Consequently, in one embodiment, the upper body of the source or drain interconnect feature is not aligned to the corresponding lower body of the source or drain interconnect feature. For example, a sidewall of the upper body is not collinear with a corresponding sidewall of the lower body. For example, a sidewall of the source or drain interconnect feature that extends from the upper body of the source or drain interconnect feature to the lower body of the source or drain interconnect feature includes an intervening step-like feature (e.g., horizontal step feature) that disrupts collinearity of the upper body sidewall with the lower body sidewall. Thus, a step-like wall portion (e.g., substantially horizontal wall portion) of the upper or lower body of the source or drain interconnect feature conjoins a vertical upper body sidewall and a vertical lower body sidewall, e.g., as discussed in further detail herein later with respect to FIGS. 1E and 1F.

In one embodiment, a gate interconnect feature is formed through the third dielectric material, the etch stop layer, and the second dielectric material, where the gate interconnect feature at least partially lands on a corresponding gate electrode. For example, a recess is formed extending through the third dielectric material, the etch stop layer, and the second dielectric material, and conductive material is deposited within the recess, to form the gate interconnect feature. In an example, the conductive material for the entire gate interconnect feature is deposited during a single deposition process (e.g., see FIGS. 3E3 and 3F3 discussed herein in turn), and hence, there is no misalignment or interface between upper and lower portions of the conductive material of the gate interconnect feature. Similarly, a sidewall of the upper portion of the gate interconnect feature is collinear and aligned with a corresponding sidewall of the lower portion of the gate interconnect feature.

Note that due to the above discussed etch selectivity between the first and second dielectric material, the recess for the gate interconnect feature extends through the second dielectric material and at least partially lands on the gate electrode, but cannot extend through the first dielectric material above the source and drain contacts. Thus, the recess, and consequently the gate interconnect feature, at least partially lands on the gate electrode, but cannot land on (or be closer than a threshold distance to) the source and drain contacts. Thus, the gate interconnect feature is self-aligned with respect to the gate electrode.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect an interconnect feature above a source or drain contact of a transistor, where the interconnect feature comprises an upper body of conductive material, a lower body of conductive material, and an interface (such as a seam or a grain boundary) between the upper and lower bodies, where the upper body is not aligned to the lower body, in an example. In some such embodiments, such tools may also be used to detect a gate interconnect feature above a gate electrode of a transistor, where the gate interconnect feature comprises a continuous and monolithic body of conductive material, without any interface between an upper and lower portion of the gate interconnect feature. Numerous configurations and variations will be apparent in light of this disclosure.

Architecture and Methodology

FIG. 1A illustrates a perspective view of a section of an integrated circuit (IC) 100 comprising (i) an array of transistors having a plurality of source or drain regions 104 (also referred to herein as diffusion regions 104), and a plurality of gate regions 126 comprising corresponding gate electrodes, (ii) a source or drain interconnect feature 110 at least partially landed on a source or drain contact, the source or drain interconnect feature having an upper body of conductive material, a lower body of conductive material, and an interface therebetween, and (iii) a gate interconnect feature 130 at least partially landed on a gate region 126, the gate interconnect feature 130 having a continuous and monolithic body of conductive material, without any interface between an upper and a lower portion of the gate interconnect feature 130, in accordance with an embodiment of the present disclosure. FIGS. 1B, 1C, and 1D illustrate various cross-sectional views of the IC 100 of FIG. 1, in accordance with an embodiment of the present disclosure.

The cross-sectional view of FIG. 1B is along line A-A' of FIG. 1A. Thus, FIG. 1B illustrates a cross-sectional or side view of the IC 100, when viewed from the right side of the perspective view of FIG. 1A. The cross-sectional view of FIG. 1C is along line B-B' of FIG. 1A. Thus, FIG. 1C illustrates a cross-sectional view of the IC 100, when viewed from the front side of the perspective view of FIG. 1A. The cross-sectional view of FIG. 1D is along line C-C' of FIG. 1A.

In the perspective view of FIG. 1A, multiple source or drain regions 104a, 104b, 104c, and 104d, and multiple gate regions 126a, 126b of multiple transistors are illustrated. For example, the source or drain region 104c, the gate region 126a, and the source or drain region 104d, in combination, form a first transistor 171 (labelled in FIG. 1B). A channel region 144 of the first transistor is not illustrated in FIG. 1A, but illustrated in FIG. 1B. Similarly, the source or drain region 104b, along with another gate region and another source or drain region (not illustrated in the perspective view of FIG. 1A), form a second transistor (not labelled in FIGS. 1A-1D). Similarly, the source or drain region 104a, along with another gate region 126c and another source or drain region (not illustrated in the perspective view of FIG. 1A, but illustrated in FIG. 1D), form a third transistor 172.

Thus, an array of transistors is illustrated in the figures, including the above discussed first, second, and third transistors. The source or drain regions 104c, 104b, and 104a are left side source or drain regions for the above discussed first, second, and third transistors, in an example.

In an example, the gate region 126a of the first transistor 171, the gate region of the second transistor, and the gate region 126c of the third transistor 172 are conductive coupled, to form a common gate region for the first, second, and third transistors. In an example, a gate interconnect feature 130 (plan view of which is illustrated in FIG. 1A, and cross-sectional view of which is illustrated in FIG. 1D) is coupled to this common gate region. As will be discussed herein in turn, a gate region 126 comprises a gate stack, that includes a gate dielectric, and a gate electrode above the gate dielectric. A gate electrode is symbolically illustrated as a corresponding gate region 126 in FIGS. 1A-1D.

Referring to FIG. 1B, illustrated is a channel region 144a between the source or drain regions 104c and 104d, where conduction in the channel region 144a is controlled by the gate region 126a. As discussed, the source or drain regions 104c, 104d, the gate region 126a, and the channel region 144a collective form, or is part of, the first transistor 171.

Similarly, referring to FIG. 1D, illustrated is a channel region 144b between the source or drain regions 104a and 104e, where conduction in the channel region 144b is controlled by the gate region 126c. As discussed, the source or drain regions 104a, 104e, the gate region 126c, and the channel region 144b collective form, or is part of, the third transistor 172. Note that the gate region 126c, the source or drain region 104e, and the channel region 144b of the third transistor 172, illustrated in FIG. 1D, are not illustrated in FIG. 1A.

According to some embodiments, the source or drain regions 104 are epitaxial regions that are provided using an etch-and-replace process. In other embodiments one or more of the source or drain regions 104 regions could be, for example, implantation-doped native portions of the semiconductor fins or substrate. Any semiconductor materials suitable for source and drain regions can be used (e.g., group IV and group III-V semiconductor materials). The source or drain regions may include multiple layers such as liners and capping layers to improve contact resistance. In any such cases, the composition and doping of the source and drain regions may be the same or different, depending on the polarity of the transistors. Any semiconductor materials suitable for source or drain regions can be used (e.g., group IV and group III-V semiconductor materials).

In some embodiments, conductive regions 106 are formed above, and conductively coupled to, corresponding source or drain regions 104. For example, FIG. 1A illustrates a common conductive region 106 above, and conductively coupled to, source or drain regions 104a, 104b, and 104c. However, in another example and although not illustrated in FIG. 1A, a first section of the conductive region 106 above the source or drain region 104a may be separate from a second section of the conductive region 106 above the source or drain region 104b, which may be separate form a second section of the conductive region 106 above the source or drain region 104c, and so on. FIGS. 1A and 1B also illustrates a conductive region 106 above, and conductively coupled to, source or drain region 104d. In one embodiment, the conductive region 106 is a source or drain contact for one or more source or drain regions 104. Thus, the conductive source or drain contact 106 contacts one or more source or drain regions 104, as illustrated in FIGS. 1A-1D.

The conductive source or drain contacts 106 may be any suitably conductive material, such as a metal or an alloy thereof. Merely as an example, the conductive source or drain contacts 106 includes one or more of tungsten (W), molybdenum (Mo), ruthenium (Ru), copper (Cu), aluminum (Al), titanium (Ti), tantalum (Ta), titanium nitride (TiN), or tantalum nitride (TaN), for example. In some embodiments, the conductive source or drain contacts 106 include one or more of the same metal materials as gate electrode 126, or a different conductive material.

In some embodiments, a dielectric material 108 is above the source or drain contacts 106, as illustrated in FIG. 1A-1D. The dielectric material 108 can be any appropriate dielectric material, such as a nitride, oxide, carbide, oxycarbide, oxycarbonitride, or a low-k version of any of these, for example. The dielectric material 108 can be, for example, silicon nitride (SiN), silicon oxide (SiO), silicon carbide (SiC), silicon oxycarbide (SiOC), silicon oxycarbonitride (SiOCN), or another appropriate dielectric material.

In some embodiments, another dielectric material 128 is above the gate regions 126, as illustrated in FIGS. 1A, 1B, and 1D. As illustrated, the dielectric material 128 separates the gate regions 126 from adjacent source or drain regions 106. Thus, the dielectric material 128 is above, and also on sides, of the gate regions 126. The dielectric material 128 can be any dielectric material, such as a nitride, oxide, carbide, oxycarbide, oxycarbonitride, or a low-k version of any of these, for example. The dielectric material 128 can be, for example, silicon nitride (SiN), silicon oxide (SiO), silicon carbide (SiC), silicon oxycarbide (SiOC), silicon oxycarbonitride (SiOCN), or another appropriate dielectric material.

In an example, the dielectric material 128 is different from, and etch selective to, the dielectric material 108. For example, an etch process to etch the dielectric material 108 does not substantially etch the dielectric material 128; and another etch process to etch the dielectric material 128 does not substantially etch the dielectric material 108. Thus, merely as an example, if the dielectric material 108 is an oxide, then the dielectric material 128 is a nitride, where the nitride and oxide dielectric materials are etch selective to each other.

In one embodiment, an etch stop layer 130 (illustrated as a thick line in FIGS. 1A-1D) is above the dielectric materials 108 and 128. In an example, the etch stop layer 130 acts to stop an etch process within another dielectric material 117 above the etch stop layer 140. In an example, the etch stop layer 130 has a thickness (e.g., a vertical height) in the range of 0.5 to 20 nanometers (nm), e.g., in the range of about 1 to 8 nm. In an example, the etch stop layer 117 comprise an appropriate dielectric material, such as silicon carbide (SiC), aluminum oxide, or another appropriate material used for an etch stop layer.

In one embodiment, a layer 117 of interlayer dielectric material (ILD) is above the etch stop layer 140. The layer 117 comprise any dielectric material or ILD material, such as a standard-k or low-k dielectric material (e.g., silicon dioxide or porous silicon dioxide). In an example, the layer 117 is etch selective to the etch stop layer 140. For example, an etch process to etch the layer 117 does not substantially etch the etch stop layer 140.

In one embodiment, the IC 100 comprises one or more source or drain interconnect features 110 that extend through the layer 117, the etch stop layer 140, and the dielectric material 108, and contacts corresponding the source or drain contacts 106. For example, FIGS. 1A and 1C illustrate a source or drain interconnect feature 110a above, and conductive coupled to, the source or drain region 104b. Similarly, FIGS. 1A and 1B illustrates a source or drain interconnect feature 110b above, and conductive coupled to, the source or drain region 104d. In an example, the source or drain interconnect feature 110 conductively couples one or more source or drain regions 104 with circuits that are above the section of the IC 100 illustrated in FIGS. 1A-1D.

As illustrated in FIG. 1C, individual source or drain interconnect feature 110 has an upper body 112 of conductive material, and a lower body 114 of conductive material, with an interface 115 between the upper and lower bodies. For example, the source or drain interconnect feature 110a has an upper body 112a of conductive material, and a lower body 114a of conductive material, with an interface 115a between the upper and lower bodies, as illustrated in FIGS. 1A and 1C. Similarly, the source or drain interconnect feature 110b has an upper body 112b of conductive material, and a lower body 114b of conductive material, with an interface 115b between the upper and lower bodies, as illustrated in FIGS. 1A and 1B.

In an example, the upper bodies 112a, 112b of the interconnect features 110a, 110b, respectively, extend within (and extend through) the layer 117 comprising ILD or dielectric material, and also extend within (and extend through) the etch stop layer 140. In an example, the upper bodies 112a, 112b do not extend within the dielectric material 108.

In an example, the lower bodies 114a, 114b of the interconnect features 110a, 110b, respectively, extend within (and extend through) the dielectric material 108. For example, FIG. 1C illustrates the lower body 114a of the source or drain interconnect feature 110a extending through the dielectric material 108. Note that although not visible in the views of FIGS. 1A and 1B, dielectric material 108 is present in front and behind the lower body 114b of the source or drain interconnect feature 110b, and hence, the lower body 114b also extends within and through the dielectric material 108.

In an example, the lower bodies 114a, 114b do not extend within the etch stop layer 140. In an example, the lower bodies 114a, 114b do not extend within the layer 117 comprising dielectric material.

In one embodiment, one or both the upper bodies 112 and lower bodies 114 of various source or drain interconnect features comprise conductive material, such as ruthenium, molybdenum, tungsten, aluminum, pure copper, an alloy such as copper-tin (CuSn), copper indium (CuIn), copper-antimony (CuSb), copper-bismuth (CuBi), copper-rhenium (CuRe), and/or any other suitable conductive material. Although not illustrated, in an example, sidewalls of the upper and/or lower bodies of the source or drain interconnect features 110 further comprise a liner or barrier layer. For example, the liner or barrier layer separates the conductive material of the source or drain interconnect features 110 from the dielectric material 108, the etch stop layer 140, and/or the layer 117. Suitable materials for the liner or barrier layer include liner layer refractory metals and alloys, cobalt, cobalt-nickel (CoNi), ruthenium-cobalt combination, molybdenum, nickel, manganese, titanium-tungsten, tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN). In an example, the liner or barrier layer reduces or prevents diffusion of the conductive material of a source or drain interconnect feature 110 to adjacent dielectric material, and/or facilitates better adhesion of the conductive material to walls of the source or drain interconnect features 110.

In one embodiment, an interface 115 is present between a lower body 114 and an upper body 112 of a source or drain interconnect feature 110, such as the interface 115a between the lower body 114a and the upper body 112a of the source or drain interconnect feature 110a, as illustrated in FIGS. 1A and 1C. In an example, for a given source or drain interconnect feature 110, the conductive material of the corresponding lower body 114 is deposited during a first deposition process, and the conductive material of the corresponding upper body 112 is deposited during a second deposition process that occurs subsequent to, and separate from, the first deposition process. This results in the interface 115 between the lower and upper bodies. In an example, the interface 115 comprises a seam or a grain boundary between conductive materials of the upper and lower bodies. In an example, the interface is substantially coplanar with a bottom surface of the etch stop layer 140 and/or with a top surface of the dielectric materials 108, 128, as illustrated.

Figure 1E:
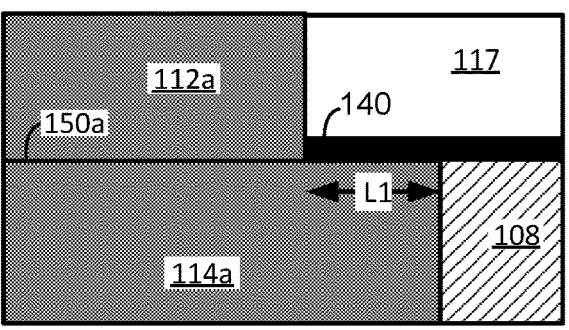
FIG. 1E illustrates a magnified view of a section of the IC of FIG. 1C, in accordance with an embodiment of the present disclosure.

FIG. 1E illustrates a magnified view of a section 111 of the IC 100 of FIG. 1C, in accordance with an embodiment of the present disclosure. Specifically, FIG. 1E illustrates a right boundary between the upper body 112a and the lower body 114a of the source or drain interconnect feature 110a. As seen in FIGS. 1A-1C and 1E, in one embodiment, an upper body 112 (e.g., upper body 112a) of a source or drain interconnect feature 110 (e.g., source or drain interconnect feature 110a) is not aligned to the corresponding lower body 114 (e.g., lower body 114a) of the source or drain interconnect feature 110 (e.g., source or drain interconnect feature 110a). For example, a sidewall of the upper body 112a is not collinear with a corresponding sidewall of the lower body 114a. For example, a sidewall of the source or drain interconnect feature 110a that extends from the upper body 112a of the source or drain interconnect feature 110a to the lower body 114a of the source or drain interconnect feature 110a includes an intervening step-like feature (e.g., horizontal step feature) that disrupts collinearity of the upper body sidewall with the lower body sidewall.

Thus, a substantially horizontal wall of the lower body 114a of the interconnect feature 110a conjoins a vertical upper body sidewall and a vertical lower body sidewall, as illustrated in FIG. 1E. In the example of FIG. 1E, the substantially horizontal wall of the lower body 114a (e.g., which is part of the top surface of the lower body 114a), which conjoins the vertical upper body sidewall and the vertical lower body sidewall, has a lateral length of L1, where L1 is between 0 to 10 nanometers (nm), or between 0 to 6 nm, or 0 to 3 nm, or 0 to 1.5 nm. In an example, L1 is at least 0.5 nm.

Thus, in an example, the upper body 112a has a first sidewall that travels entirely within a first set of one or more vertical planes, and the lower body 114a of conductive material has a second sidewall that travels entirely within a second set of one or more vertical planes, and the first and second sets of vertical planes are laterally offset from each other such that they do not overlap.

In an example and as will be discussed herein later, in a source or drain interconnect feature 110, the conductive material of the corresponding lower body 114 is deposited during a first deposition process, and the conductive material of the corresponding upper body 112 is deposited during a second deposition process that occurs subsequent to, and separate from, the first deposition process. For example, referring specifically to the source or drain interconnect feature 110a, during the second deposition process, initially a recess is formed above the lower body 114a and within the layer 117 and the etch stop layer 140 (e.g., see FIGS. 3E1 and 3E2 discussed herein later). In an example, the recess may not be perfectly aligned with the lower body 114a, e.g., due to technical limitations in placing the mask for forming the recess. Subsequently, the recess is filed with conductive material, for forming the upper body 112a (e.g., see FIGS. 3F1, 3F2 discussed herein later). Accordingly, in an example, as the recess is not aligned with the lower body 114a, the upper body 112a is not also aligned with the lower body 114a.

Figure 1F:
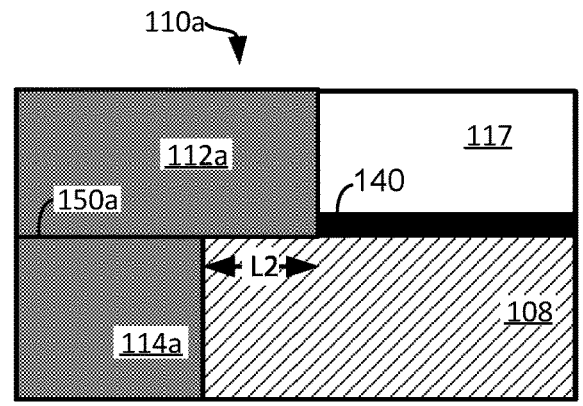
FIG. 1F illustrates an example misalignment between an upper body and a lower body of a source or drain interconnect feature of the IC of FIGS. 1A-1D, in accordance with an embodiment of the present disclosure.

FIG. 1F illustrates an example misalignment between an upper body 112a and a lower body 114a of the interconnect feature 110a of the IC 100 of FIGS. 1A-1D, in accordance with an embodiment of the present disclosure. For example, in the misalignment of previously discussed FIG. 1E, a horizontal wall, which is a top wall of the lower body 114a, is between a vertical sidewall of the upper body 112a and a vertical sidewall of the lower body 114a. In contrast, in the misalignment of FIG. 1F, a horizontal wall, which is a bottom wall of the upper body 112a, is between the vertical sidewall of the upper body 112a and the vertical sidewall of the lower body 114a. In the example of FIG. 1F, the substantially horizontal wall of the upper body 112a (e.g., which is part of the bottom surface of the upper body 112a), which conjoins the vertical upper body sidewall and the vertical lower body sidewall, has a lateral length of L2, where L2 is between 0 to 10 nm, or between 0 to 6 nm, or 0 to 3 nm, or 0 to 1.5 nm. In an example, L2 is at least 0.5 nm.

Referring again to FIGS. 1A-1D, a gate region 126 in the figures symbolically illustrate a gate electrode, and may also include gate dielectric (not illustrated) below the gate electrode. In one embodiment, the IC 100 comprises one or more gate interconnect features 130 that extends through the layer 117, the etch stop layer 140, and the dielectric material 128, and contacts the gate region 126. For example, FIG. 1D illustrates a gate interconnect feature 130 above, and conductive coupled to, the gate region 126c. FIG. 1A illustrates a top surface of the gate interconnect feature 130. In an example, the gate interconnect feature 130 conductively couples one or more gate regions 126 with circuits that are above the section of the IC 100 illustrated in FIGS. 1A-1D.

Note that in an example, the gate region 126a of the transistor 171 (see FIGS. 1A and 1B) is shorted with the gate region 126c of the transistor 172 (see FIGS. 1A and 1D), to form a common gate region. For example, there is a common and continuous gate electrode that is common to both the gate regions 126a and 126c. Accordingly, the gate interconnect feature 130 serves to couple both gate regions 126a and 126c with circuits that are above the section of the IC 100 illustrated in FIGS. 1A-1D.

However, in another example, the gate region 126a of the transistor 171 is separate from, and not conductively coupled with, the gate region 126 of the transistor 172. In such an example and although not illustrated in FIGS. 1A-1D, there is a separate gate interconnect feature specifically for the gate region 126a of the transistor 171. Thus, although a single gate interconnect feature 130 is illustrated in FIGS. 1A-1D, the IC 100 may include several such similar gate interconnect features, including a possible gate interconnect feature above the gate region 126a of the transistor 171.

As illustrated in FIG. 1D, the gate interconnect feature 130 comprises a continuous and monolithic body of conductive material that extend within (and extend through) the layer 117, the etch stop layer 140, and the dielectric material 128. For example, individual source or drain interconnect features 110 included an upper body 112, a lower body 114, and in interface 115 therebetween. In contrast, the gate interconnect feature 130 comprises a single continuous and monolithic body of conductive material, without any interface between upper and lower portions of the gate interconnect feature 130. In an example, the conductive material for the entire gate interconnect feature 130 is deposited during a single deposition process (e.g., see FIGS. 3E3 and 3F3 discussed herein in turn), and hence, there is no misalignment or interface between the upper and lower portions of the conductive material of the gate interconnect feature 130. Thus, a sidewall of the upper portion of the gate interconnect feature 130 is collinear and aligned with a corresponding sidewall of the lower portion of the gate interconnect feature 130.

In one embodiment, the conductive material of the gate interconnect feature 130 comprises conductive material, such as ruthenium, molybdenum, tungsten, aluminum, pure copper, an alloy such as copper-tin (CuSn), copper indium (CuIn), copper-antimony (CuSb), copper-bismuth (CuBi), copper-rhenium (CuRe), and/or any other suitable conductive material. Although not illustrated, in an example, sidewalls of the gate interconnect feature 130 further comprise a liner or barrier layer. For example, the liner or barrier layer separates the conductive material of the gate interconnect features 130 from adjacent dielectric material. Suitable materials for the liner or barrier layer include liner layer refractory metals and alloys, cobalt, cobalt-nickel (CoNi), ruthenium-cobalt combination, molybdenum, nickel, manganese, titanium-tungsten, tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN). In an example, the liner or barrier layer reduces or prevents diffusion of the conductive material of a gate interconnect feature 130 to adjacent dielectric material, and/or facilitates better adhesion of the conductive material to walls of the gate interconnect feature 130.

Figure 2:
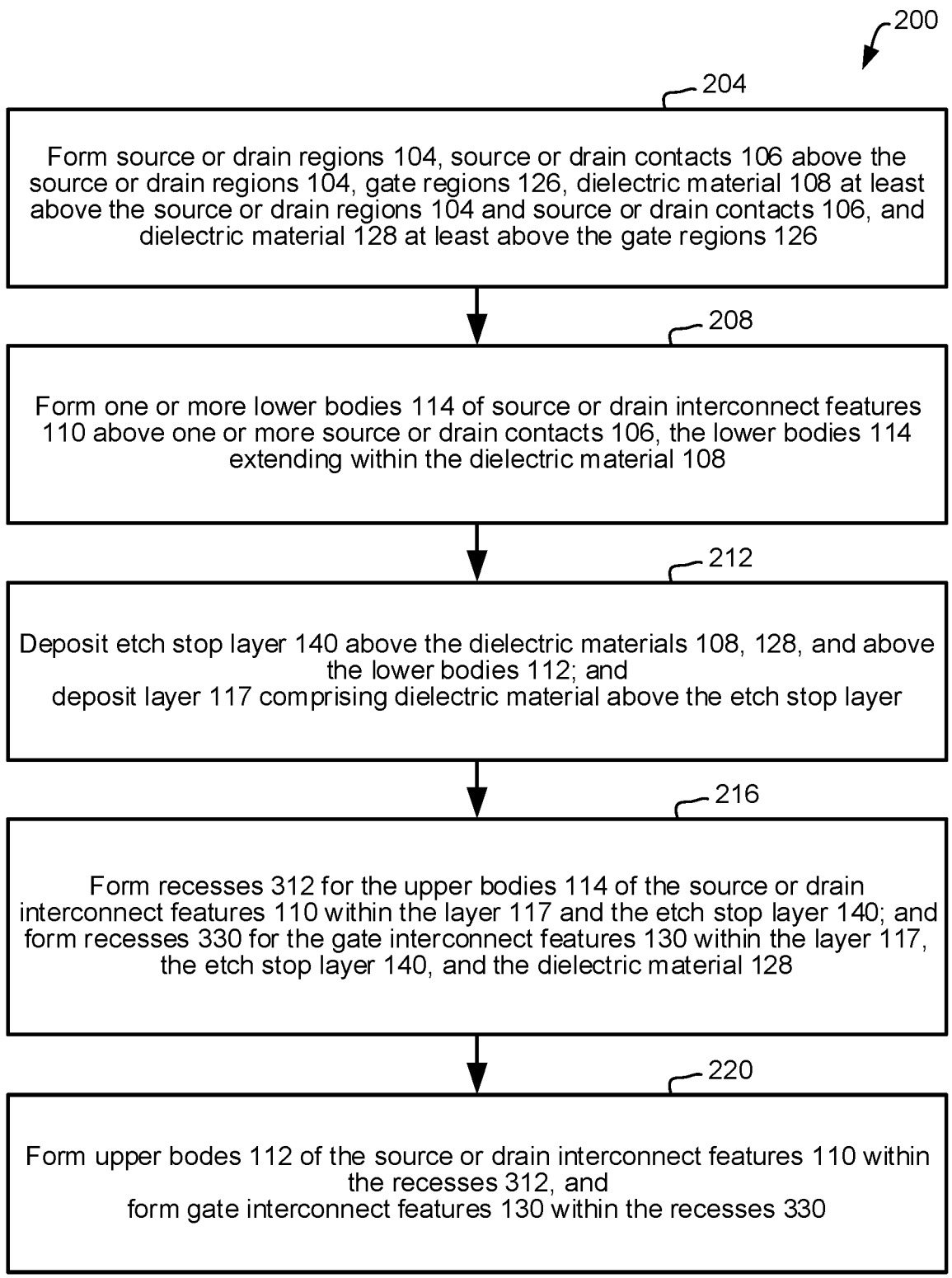
FIG. 2 illustrates a flowchart depicting a method of forming an IC (such as the IC of FIGS. 1A-1F) comprising (i) an array of transistors having a plurality of source or drain (e.g., diffusion) regions, and a plurality of gate regions, (ii) a source or drain interconnect feature having an upper body of conductive material, a lower body of conductive material, and an interface therebetween, and (iii) a gate interconnect feature having a continuous and monolithic body of conductive material, without any interface between an upper and a lower portion of the gate interconnect feature, in accordance with an embodiment of the present disclosure.

FIG. 2 illustrates a flowchart depicting a method 200 of forming an IC (such as the IC 100 of FIGS. 1A-1F) comprising (i) an array of transistors having a plurality of source or drain regions 104, and a plurality of gate regions 126, (ii) a source or drain interconnect feature 110 having an upper body of conductive material, a lower body of conductive material, and an interface therebetween, and (iii) a gate interconnect feature 130 having a continuous and monolithic body of conductive material, without any interface between an upper and a lower portion of the gate interconnect feature 130, in accordance with an embodiment of the present disclosure. FIGS. 3A1, 3A2, 3A3, 3B1, 3B2, 3B3, 3C1, 3C2, 3C3, 3D1, 3D2, 3D3, 3E1, 3E2, 3E3, 3F1, 3F2, and 3F3 illustrate various cross-sectional views of an IC (such as the IC 100 of FIGS. 1A-1F) in various stages of processing, in accordance with an embodiment of the present disclosure. FIGS. 2 and 3A1-3F3 will be discussed in unison.

The cross-sectional views of FIGS. 3A1, 3B1, 3C1, 3D1, 3E1, and 3F1 are similar to that of FIG. 1B, e.g., along line A-A' of FIG. 1A. Thus, FIGS. 3A1, 3B1, 3C1, 3D1, 3E1, and 3F1 illustrate cross-sectional or side views of the IC 100, when viewed from the right side of the perspective view of FIG. 1A. The cross-sectional views of FIGS. 3A2, 3B2, 3C2, 3D2, 3E2, and 3F2 are similar to that of FIG. 1C, e.g., along line B-B' of FIG. 1A. Thus, FIGS. 3A2, 3B2, 3C2, 3D2, 3E2, and 3F2 illustrate cross-sectional or side views of the IC 100, when viewed from the front side of the perspective view of FIG. 1A. The cross-sectional views of FIGS. 3A3, 3B3, 3C3, 3D3, 3E3, and 3F3 are similar to that of FIG. 1D, e.g., along line C-C' of FIG. 1A. Thus, FIGS. 3A3, 3B3, 3C3, 3D3, 3E3, and 3F3 illustrate cross-sectional views of the IC 100 that illustrate the above discussed transistor 172 comprising the source or drain region 104a.

Referring to FIG. 2, the method 200 includes, at 204, forming source or drain regions 104, source or drain contacts 106 above the source or drain regions 104, gate regions 126 (e.g., comprising corresponding gate electrodes), dielectric material 108 at least above the source or drain regions 104 and source or drain contacts 106, and dielectric material 128 at least above the gate regions 126, as illustrated in FIGS. 3A1, 3A2, and 3A3. For example, FIG. 3A1 illustrates the transistor 171 comprising the source or drain regions 104c, 104d, gate region 126a, channel region 144a, source or drain contacts 106 above the source or drain regions 104, dielectric material 108 at least above the source or drain contacts 106, and dielectric material 128 at least above the gate region 126a. The various regions, contacts, and dielectric material are formed, for example, using any appropriate technique to form transistors, source or drain contacts, and dielectric materials above source or drain contacts and above gate regions.

Referring again to FIG. 2, the method 200 then proceeds from 204 to 208, where one or more lower bodies 114 of source or drain interconnect features 110 are formed above corresponding one or more source or drain contacts 106, where the lower bodies 114 extend within the dielectric material 108, as illustrated in FIGS. 3B1, 3B2, 3B3, 3C1, 3C2, and 3C3. For example, FIG. 3C1 illustrates the lower body 114b of the source or drain interconnect feature 110b formed above the source or drain contact 106, which is above the source or drain region 104d. FIG. 3C2 illustrates the lower body 114a of the source or drain interconnect feature 110a formed above the source or drain contact 106, which is above the source or drain region 104b.

In an example, to form a lower body 114 of a source or drain interconnect feature 110, a recess 314 is formed within the dielectric material 108 above the corresponding source or drain contact 106 using suitable masking, lithography, and etching technique, such as an anisotropic etch process, as illustrated in FIGS. 3B1 and 3B2. Subsequently, the recess 314 is filed with conductive material, to form the corresponding lower body 114. In an example, the conductive material are deposited using an appropriate deposition technique, such as chemical vapor deposition (CVD), physical vapor deposition (PVD), atomic layer deposition (ALD), vapor-phase epitaxy (VPE), molecular beam epitaxy (MBE), liquid-phase epitaxy (LPE), or electroplating, for example. In an example, prior to depositing the conductive material, the recess is lined with a liner or barrier layer, as discussed herein previously. In an example, the liner or barrier layers are deposited using an appropriate deposition technique, such as CVD, PVD, ALD, VPE, MBE, or LPE, for example.

As previously discussed herein, the dielectric material 108 is etch selective to the dielectric material 128. For example, an etch process to etch the dielectric material 108 does not substantially etch the dielectric material 128. Also, the recesses 314 of FIGS. 3B1 and 3B2 for the lower bodies 114 are formed within the dielectric material 108 that is above the source or drain contacts 106. Due to the above discussed etch selectivity, the process for formation of the recesses within the dielectric material 108 does not substantially etch the dielectric material 128. Accordingly, due to technical limitations in placing the masks for forming the recesses 314, even if the mask is unintentionally shifted, the recesses 314 will not be formed within the dielectric material 128 (as the etch process cannot substantially etch the dielectric material 128). Put differently, the recesses 314 fully or at least partially lands on the source or drain contacts 106, but cannot land on an adjacent gate region 126. Thus, the recesses 314 are self-aligned with respect to the source or drain contacts 106, and cannot be formed over the gate region 126, e.g., even if the masks for forming the recesses 314 are unintentionally shifted.

Referring again to FIG. 2, the method 200 then proceeds from 208 to 212, where etch stop layer 140 is deposited above the dielectric materials 108, 128, and above the lower bodies 112, and where layer 117 comprising dielectric material is deposited above the etch stop layer 140, e.g., as illustrated in FIGS. 3D1, 3D2, 3D3. In one embodiment, one or both the etch stop layer 140 and the dielectric material of the layer 117 are deposited using an appropriate deposition technique, such as CVD, PVD, ALD, VPE, MBE, or LPE, for example.

Referring again to FIG. 2, the method 200 then proceeds from 212 to 216, where recesses 312 are formed for the upper bodies 114 of the source or drain interconnect features 110 within the layer 117 and the etch stop layer 140, and where recesses 330 are formed for the gate interconnect features 130 within the layer 117, the etch stop layer 140, and the dielectric material 128, as illustrated in FIGS. 3E1, 3E2, and 3E3.

In an example, the recesses 312 and/or 330 for formed using suitable masking, lithography, and etching technique, such as an anisotropic etch process. As illustrated in FIG. 3E1, the recess 312b is formed above the lower body 114b of the source or drain interconnect feature 110b. Similarly, as illustrated in FIG. 3E2, the recess 312a is formed above the lower body 114a of the source or drain interconnect feature 110a. Because of technical limitations in accurately placing the masks for the recesses 312 (e.g., recess 312a of FIG. 3E1), the recess 312a may not be fully aligned with respect to the lower body 114a of the source or drain interconnect feature 110a. This subsequently results in the non-alignment of the upper and lower bodies of the source or drain interconnect feature 110a, e.g., as discussed with respect to FIG. 1E or 1F.

In an example, the recess 330 (in which the gate interconnect feature 130 is to be subsequently formed) is formed by a single recess formation process. Thus, unlike the source or drain interconnect features, the recess 330 for the gate interconnect features do not have any misalignment between a corresponding upper portion and a corresponding lower portion.

As previously discussed herein, the dielectric material 128 is etch selective to the dielectric material 108. For example, an etch process to etch the dielectric material 128 does not substantially etch the dielectric material 108. Also, the recess 330 of FIG. 3E3 for eventual formation of the gate interconnect feature 130 is formed within the dielectric material 128 that is above the gate region 126c. Due to the above discussed etch selectivity, the process for formation of the recess 330 within the dielectric material 128 does not substantially etch the dielectric material 108. Accordingly, due to technical limitations in placing the mask for forming the recess 330, even if the mask is unintentionally shifted, the recesses 330 will not be formed within the dielectric material 108 (as the etch process cannot substantially etch the dielectric material 108). Put differently, the recess 330 fully or at least partially lands on the gate region 126c, but cannot land on an adjacent source or drain contact 106 that is protected by the dielectric material 108. Thus, the recess 330 is self-aligned with respect to the gat region 126c, and cannot be formed over the source or drain contacts 106, e.g., even if the mask for forming the recess 330 is unintentionally shifted.

In an example, the recesses 312 and the recess 330 may be formed during different recess formation processes. For example, the recesses 312 are formed first, followed by formation of the recess 330. In another example, the recess 330 is formed first, followed by formation of the recesses 312.

Referring again to FIG. 2, the method 200 then proceeds from 216 to 220, where upper bodes 112 of the source or drain interconnect features 110 are formed within the recesses 312, and where gate interconnect feature 130 is formed within the recess 330, as illustrated in FIGS. 3F1, 3F2, and 3F3. For example, the recesses 312 and 330 are filed with conductive material, to respectively form the corresponding upper bodies 114 of the source or drain interconnect features 110, and the gate interconnect feature 130. In an example, the conductive materials are deposited using an appropriate deposition technique, such as CVD, PVD, ALD, VPE, MBE, LPE, or electroplating, for example. In an example, prior to depositing the conductive material, individual recesses may be lined with a liner or barrier layer, as discussed herein above. In an example, the liner or barrier layers are deposited using an appropriate deposition technique, such as CVD, PVD, ALD, VPE, MBE, or LPE, for example.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Example System

Figure 4:
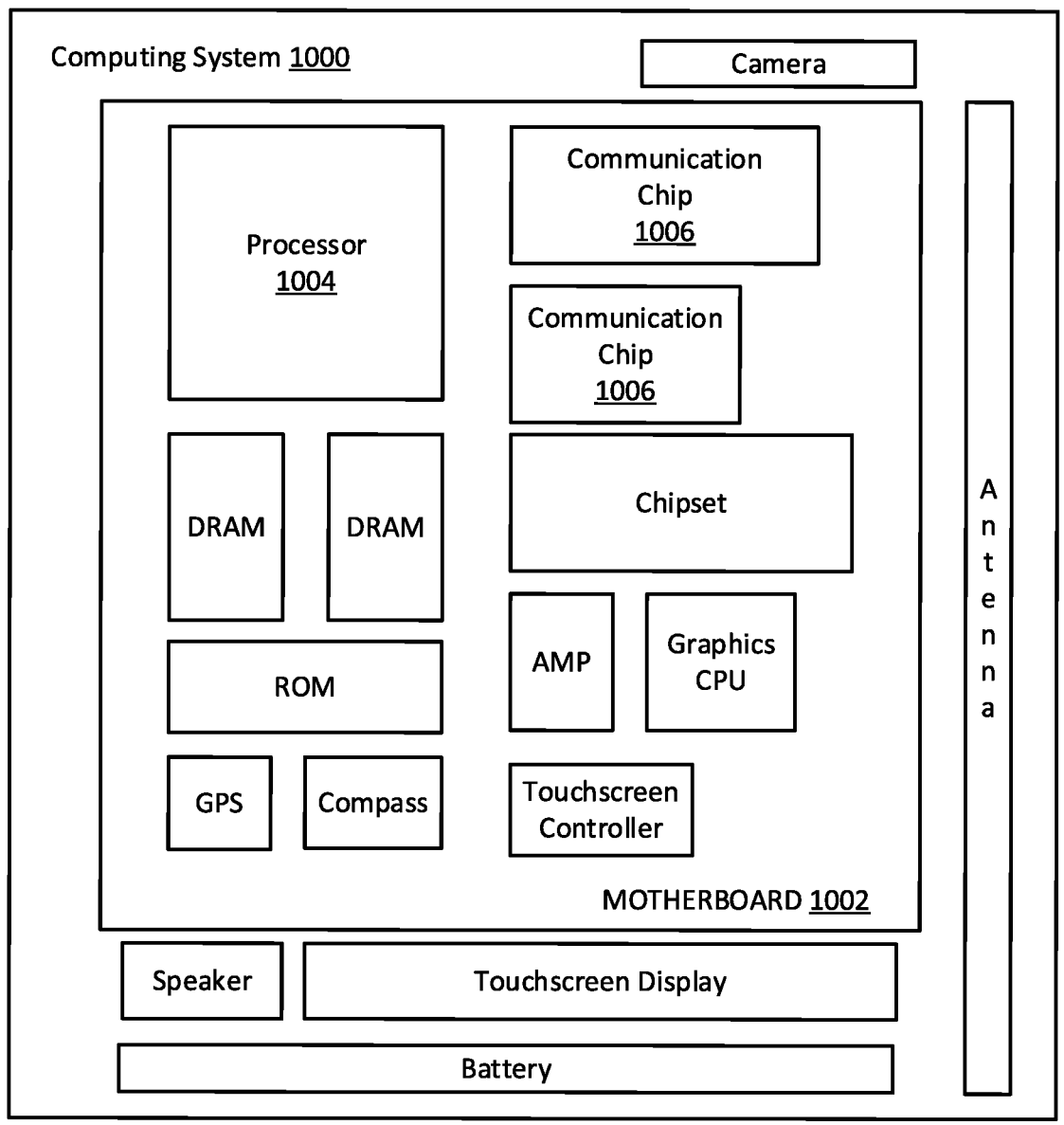
FIG. 4 illustrates a computing system implemented with integrated circuit structures having one or more interconnect features formed using the techniques disclosed herein, in accordance with some embodiments of the present disclosure.

FIG. 4 illustrates a computing system 1000 implemented with integrated circuit structures and/or the interconnect features formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following clauses pertain to further embodiments, from which numerous permutations and configurations will be apparent.

Example 1. An integrated circuit comprising: a first transistor device having (i) a first source or drain region coupled to a first source or drain contact, and (ii) a first gate electrode; a second transistor device having (i) a second source or drain region coupled to a second source or drain contact, and (ii) a second gate electrode; a first dielectric material above the first and second source or drain contacts; a second dielectric material above the first and second gate electrodes, the first dielectric material compositionally different from the second dielectric material; a third dielectric material above the first and second dielectric materials; a first interconnect feature above and conductively coupled to the first source or drain contact, wherein the first interconnect feature comprises (i) an upper body of conductive material extending within the third dielectric material, and (ii) a lower body of conductive material extending within the first dielectric material, with an interface between the upper body and the lower body; and a second interconnect feature above and conductively coupled to one or both of the first and second gate electrodes, wherein the second interconnect feature comprises a continuous and monolithic body of conductive material extending within the third dielectric material and the second dielectric material.

Example 2. The integrated circuit of example 1, further comprising: an etch stop layer between the third dielectric material and the first dielectric material, and also between the third dielectric material and the second dielectric material, wherein the upper body of conductive material also extends through the etch stop layer.

Example 3. The integrated circuit of example 2, wherein the interface is substantially coplanar with a bottom surface of the etch stop layer.

Example 4. The integrated circuit of any one of examples 1-3, wherein the interface is a seam or grain boundary between the conductive material of the upper body and the conductive material of the lower body.

Example 5. The integrated circuit of any one of examples 1-4, wherein the upper body of conductive material is not aligned with the lower body of conductive material.

Example 6. The integrated circuit of any one of examples 1-5, wherein the upper body of conductive material is not aligned with the lower body of conductive material, such that there is a substantially horizontal wall of either the upper body or the lower body between (i) a substantially vertical sidewall of the upper body and (ii) a substantially vertical sidewall of the lower body.

Example 7. The integrated circuit of any one of examples 1-6, wherein the upper body of conductive material is not aligned with the lower body of conductive material, such that there is a step-like wall portion of either the upper body or the lower body between (i) a first sidewall of the upper body and (ii) a second sidewall of the lower body, wherein the step-like wall portion is closer to being horizontal than the first and second sidewalls.

Example 8. The integrated circuit of any one of examples 1-7, wherein the upper body of conductive material has a sidewall that is not collinear with a corresponding sidewall of the lower body of conductive material.

Example 9. The integrated circuit of any one of examples 1-8, wherein the upper body of conductive material has a first sidewall that travels entirely within a first set of one or more vertical planes, and the lower body of conductive material has a second sidewall that travels entirely within a second set of one or more vertical planes, and the first and second sets of vertical planes are laterally offset from each other such that they do not overlap.

Example 10. The integrated circuit of any one of examples 1-9, wherein an upper portion of the second interconnect feature extends through the third dielectric material, a lower portion of the second interconnect feature extends through the second dielectric material, and the upper portion of the second interconnect is aligned with respect to the lower portion of the second interconnect.

Example 11. The integrated circuit of any one of examples 1-10, wherein the upper body is above and at least partially landed on the lower body.

Example 12. The integrated circuit of any one of examples 1-11, wherein the first dielectric material is etch selective relative to the second di electric material.

Example 13. The integrated circuit of any one of examples 1-12, wherein the first dielectric material comprises one or more of silicon, nitrogen, oxygen, carbon, and wherein the second dielectric material comprises another one or more of silicon, nitrogen, oxygen, carbon.

Example 14. The integrated circuit of any one of examples 1-13, wherein the conductive materials of one or both the first and second interconnect features comprise one or more of ruthenium, molybdenum, tungsten, aluminum, copper, tin, indium, antimony, or bismuth.

Example 15. An integrated circuit comprising: a transistor device having a (i) a source region, with a source contact conductively coupled to and above the source region, and (ii) a gate electrode; a first layer comprising a first dielectric material above the source contact, a second layer comprising a second dielectric material above the gate electrode, and a third layer comprising a third dielectric material above the first and second layers, the first dielectric material different from the second dielectric material; and an interconnect feature extending through the third layer and the first layer, and conductively coupled to the source contact, wherein an upper section of the interconnect feature extends at least in part within the third layer, a lower section of the interconnect feature extends at least in part within the first layer, and the upper section of the interconnect feature is not aligned with the lower section of the interconnect feature.

Example 16. The integrated circuit of example 15, wherein the upper section of the interconnect feature is not aligned with the lower section of the interconnect feature, such that a substantially horizontal wall of either the upper section or the lower section is between (i) a substantially vertical sidewall of the upper section of the interconnect feature and (ii) a substantially vertical sidewall of the lower section of the interconnect feature.

Example 17. The integrated circuit of example 16, wherein the substantially horizontal wall is at least 0.5 nanometer long.

Example 18. The integrated circuit of any one of examples 15-17, wherein the upper section of the interconnect feature is not aligned with the lower section of the interconnect feature, such that a sidewall of the upper section of the interconnect feature is not collinear with a corresponding sidewall of the lower section of the interconnect feature.

Example 19. The integrated circuit of any one of examples 15-18, wherein the upper section of the interconnect feature is not aligned with the lower section of the interconnect feature, such that a sidewall of the interconnect feature that extends from the upper section of the interconnect feature to the lower section of the interconnect feature includes an intervening step feature that disrupts collinearity of the upper section sidewall with the lower section sidewall.

Example 20. The integrated circuit of any one of examples 15-19, wherein the interconnect feature includes an interface between conductive material of the upper section of the interconnect feature and conductive material of the lower section of the interconnect feature.

Example 21. The integrated circuit of any one of examples 15-20, wherein the interconnect feature is a first interconnect feature, and wherein the integrated circuit further comprises: a second interconnect feature extending through the third layer and the second layer, and conductively coupled to the gate electrode, wherein an upper section of the second interconnect feature extends within the third layer, a lower section of the second interconnect feature extends within the second layer, and the upper section of the second interconnect feature is substantially aligned with the lower section of the second interconnect feature.

Example 22. The integrated circuit of example 21, wherein the upper section of the second interconnect feature is substantially aligned with the lower section of the second interconnect feature, such that a sidewall of the upper section of the second interconnect feature is substantially collinear with a corresponding sidewall of the lower section of the second interconnect feature.

Example 23. The integrated circuit of any one of examples 15-22, further comprising: an etch stop layer between the third layer and the first layer, and also between the third layer and the second layer, wherein the upper section of the interconnect feature further extends within the etch stop layer.

Example 24. A method for forming an integrated circuit, the method comprising: forming a transistor device having a source region, with a source contact conductively coupled to and above the source region, and a gate electrode; forming a first layer comprising a first dielectric material above the source contact, and a second layer comprising a second dielectric material above the gate electrode, the first dielectric material different from the second dielectric material; forming a lower body of a first interconnect feature that extends within the first layer and that at least partially lands on the source contact; subsequent to forming the lower body, forming a third layer comprising a third dielectric material above the first and second layers, and the lower body of the first interconnect feature; and subsequent to forming the third layer, forming (i) an upper body of the first interconnect feature that extends within the third layer and that at least partially lands on the lower body of the first interconnect feature, and (ii) a second interconnect feature that extends within the third and second layers, and that at least partially lands on the gate electrode.

Example 25. The method of example 24, wherein the first interconnect feature comprises the lower body, the upper body at least partially over the lower body, and an interface between the upper body and the lower body.

Example 26. The method of any one of examples 24-25, wherein forming the second interconnect feature comprises depositing a continuous and monolithic body of conductive material within a recess that extends within the third and second layers.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
    a first transistor device having (i) a first source or drain region coupled to a first source or drain contact, and (ii) a first gate electrode;
    a second transistor device having (i) a second source or drain region coupled to a second source or drain contact, and (ii) a second gate electrode;
    a first dielectric material above the first and second source or drain contacts;
    a second dielectric material above the first and second gate electrodes and extending along sidewalls of the first and second gate electrodes, the first dielectric material compositionally different from the second dielectric material;
    a third dielectric material above the first and second dielectric materials;
    a first interconnect feature above and conductively coupled to the first source or drain contact, wherein the first interconnect feature comprises (i) an upper body of conductive material extending within the third dielectric material, and (ii) a lower body of conductive material extending within the first dielectric material, with an interface between the upper body and the lower body; and
    a second interconnect feature above and conductively coupled to one or both of the first and second gate electrodes, wherein the second interconnect feature comprises a continuous and monolithic body of conductive material extending within the third dielectric material and the second dielectric material.

2. The integrated circuit of claim 1, further comprising:
an etch stop layer between the third dielectric material and the first dielectric material, and also between the third dielectric material and the second dielectric material,
wherein the upper body of conductive material also extends through the etch stop layer.

3. The integrated circuit of claim 2, wherein the interface is substantially coplanar with a bottom surface of the etch stop layer.

4. The integrated circuit of claim 1, wherein the interface is a seam or grain boundary between the conductive material of the upper body and the conductive material of the lower body.

5. The integrated circuit of claim 1, wherein the upper body of conductive material is not aligned with the lower body of conductive material.

6. The integrated circuit of claim 1, wherein the upper body of conductive material is not aligned with the lower body of conductive material, such that there is a substantially horizontal wall of either the upper body or the lower body between (i) a substantially vertical sidewall of the upper body and (ii) a substantially vertical sidewall of the lower body.

7. The integrated circuit of claim 1, wherein the upper body of conductive material is not aligned with the lower body of conductive material, such that there is a step-like wall portion of either the upper body or the lower body between (i) a first sidewall of the upper body and (ii) a second sidewall of the lower body, wherein the step-like wall portion is closer to being horizontal than the first and second sidewalls.

8. The integrated circuit of claim 1, wherein the upper body of conductive material has a sidewall that is not collinear with a corresponding sidewall of the lower body of conductive material.

9. The integrated circuit of claim 1, wherein an upper portion of the second interconnect feature extends through the third dielectric material, a lower portion of the second interconnect feature extends through the second dielectric material, and the upper portion of the second interconnect is aligned with respect to the lower portion of the second interconnect.

10. The integrated circuit of claim 1, wherein the upper body is above and at least partially landed on the lower body.

11. The integrated circuit of claim 1, wherein the first dielectric material is etch selective relative to the second dielectric material.

12. The integrated circuit of claim 1, wherein the first dielectric material comprises one or more of silicon, nitrogen, oxygen, carbon, and wherein the second dielectric material comprises another one or more of silicon, nitrogen, oxygen, carbon.

13. An integrated circuit comprising:
a transistor device having a (i) a source region, with a source contact conductively coupled to and above the source region, and (ii) a gate electrode;
a first layer comprising a first dielectric material above the source contact, a second layer comprising a second dielectric material above the gate electrode and extending along sidewalls of the gate electrode, and a third layer comprising a third dielectric material above the first and second layers, the first dielectric material different from the second dielectric material; and
an interconnect feature extending through the third layer and the first layer, and conductively coupled to the source contact, wherein an upper section of the interconnect feature extends at least in part within the third layer, a lower section of the interconnect feature extends at least in part within the first layer, and the upper section of the interconnect feature is not aligned with the lower section of the interconnect feature.

14. The integrated circuit of claim 13, wherein the upper section of the interconnect feature is not aligned with the lower section of the interconnect feature, such that a substantially horizontal wall of either the upper section or the lower section is between (i) a substantially vertical sidewall of the upper section of the interconnect feature and (ii) a substantially vertical sidewall of the lower section of the interconnect feature.

15. The integrated circuit of claim 13, wherein the interconnect feature includes an interface between conductive material of the upper section of the interconnect feature and conductive material of the lower section of the interconnect feature.

16. The integrated circuit of claim 13, wherein the interconnect feature is a first interconnect feature, and wherein the integrated circuit further comprises:
a second interconnect feature extending through the third layer and the second layer, and conductively coupled to the gate electrode, wherein an upper section of the second interconnect feature extends within the third layer, a lower section of the second interconnect feature extends within the second layer, and the upper section of the second interconnect feature is substantially aligned with the lower section of the second interconnect feature.

17. The integrated circuit of claim 13, further comprising:
an etch stop layer between the third layer and the first layer, and also between the third layer and the second layer,
wherein the upper section of the interconnect feature further extends within the etch stop layer.

18. A method for forming an integrated circuit, the method comprising:
forming a transistor device having a source region, with a source contact conductively coupled to and above the source region, and a gate electrode;
forming a first layer comprising a first dielectric material above the source contact, and a second layer comprising a second dielectric material above the gate electrode and extending along sidewalls of the gate electrode, the first dielectric material different from the second dielectric material;
forming a lower body of a first interconnect feature that extends within the first layer and that at least partially lands on the source contact;
subsequent to forming the lower body, forming a third layer comprising a third dielectric material above the first and second layers, and the lower body of the first interconnect feature; and
subsequent to forming the third layer, forming (i) an upper body of the first interconnect feature that extends within the third layer and that at least partially lands on the lower body of the first interconnect feature, and (ii) a second interconnect feature that extends within the third and second layers, and that at least partially lands on the gate electrode.

19. The method of claim 18, wherein the first interconnect feature comprises the lower body, the upper body at least partially over the lower body, and an interface between the upper body and the lower body.

20. The method of claim 18, wherein forming the second interconnect feature comprises depositing a continuous and monolithic body of conductive material within a recess that extends within the third and second layers.

* * * * *